United States Patent
Chen et al.

(10) Patent No.: US 10,660,234 B2
(45) Date of Patent: May 19, 2020

(54) COMPUTER DEVICE AND HOT SWAPPABLE FAN MODULE THEREOF

(71) Applicant: Quanta Computer Inc., Taoyuan (TW)

(72) Inventors: Chao-Jung Chen, Taoyuan (TW); Yaw-Tzorng Tsorng, Taoyuan (TW); Po-Chen Liu, Taoyuan (TW); Wei-Chih Hung, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 527 days.

(21) Appl. No.: 15/389,010

(22) Filed: Dec. 22, 2016

(65) Prior Publication Data

US 2018/0100512 A1 Apr. 12, 2018

(30) Foreign Application Priority Data

Oct. 11, 2016 (TW) .............................. 105132753 A

(51) Int. Cl.
| | |
|---|---|
| F04D 25/08 | (2006.01) |
| H05K 7/20 | (2006.01) |
| F04D 19/00 | (2006.01) |
| F04D 29/70 | (2006.01) |
| F04D 29/52 | (2006.01) |
| F21V 8/00 | (2006.01) |

(52) U.S. Cl.
CPC ....... *H05K 7/20172* (2013.01); *F04D 19/002* (2013.01); *F04D 25/08* (2013.01);
(Continued)

(58) Field of Classification Search
CPC ...... F04D 25/08; F04D 29/703; F04D 29/522; F04D 29/325; F04D 19/002; H05K 7/20172; H05K 7/20727; G02B 6/008
See application file for complete search history.

(56) References Cited

U.S. PATENT DOCUMENTS

| | | | | |
|---|---|---|---|---|
| 5,448,118 A | * | 9/1995 | Nakamura | ............... H02K 9/19 |
| | | | | 310/54 |
| 6,046,460 A | * | 4/2000 | Mertins | ............... A61C 19/004 |
| | | | | 250/504 H |

(Continued)

FOREIGN PATENT DOCUMENTS

| | | |
|---|---|---|
| CN | 200978814 Y | 11/2007 |
| CN | 201747680 U | 2/2011 |

(Continued)

OTHER PUBLICATIONS

JP Office Action for Application No. 2017-097020, dated Apr. 17, 2018, w/ First Office Action Summary.

(Continued)

*Primary Examiner* — Devon C Kramer
*Assistant Examiner* — Christopher J Brunjes
(74) *Attorney, Agent, or Firm* — Nixon Peabody LLP; Zhou Lu

(57) ABSTRACT

A hot swappable fan module includes an outer frame, a cooling fan, a fixing element, and a light guide assembly. The cooling fan is located on one side of the outer frame. The fixing element is operable to fix the outer frame and the cooling fan. The light guide assembly includes a light guide post, a first stopping portion, and a second stopping portion. The light guide post penetrates through the cooling fan and the outer frame. The first stopping portion is located on the light guide post, and abuts against one surface of the cooling fan opposite to the outer frame. The second stopping portion is arranged opposite to the first stopping portion, is light-transmittable, and is optically coupled to the light guide post, and abuts against one surface of the outer frame opposite to the cooling fan.

14 Claims, 4 Drawing Sheets

(52) U.S. Cl.
CPC ......... *F04D 29/522* (2013.01); *F04D 29/703* (2013.01); *G02B 6/0008* (2013.01); *H05K 7/20727* (2013.01)

(56) References Cited

U.S. PATENT DOCUMENTS

| | | | |
|---|---|---|---|
| 6,750,562 B2 | 6/2004 | Rolls et al. | |
| 9,253,927 B1 * | 2/2016 | Kull | H05K 7/20581 |
| 2010/0231406 A1 * | 9/2010 | Hayden, Sr. | G02B 6/0008 340/691.1 |
| 2012/0257999 A1 * | 10/2012 | Hsieh | F04D 25/0613 417/423.14 |

FOREIGN PATENT DOCUMENTS

| | | |
|---|---|---|
| CN | 202443373 U | 9/2012 |
| CN | 204129632 U | 1/2015 |
| CN | 105718408 A | 6/2016 |
| CN | 205401185 U | 7/2016 |
| JP | 11984062308 U | 4/1984 |
| JP | 05-121886 | 5/1993 |
| JP | 08148927 A * | 6/1996 |
| JP | 2013138032 A | 7/2013 |
| JP | 2014232749 A | 12/2014 |
| TW | 200521336 A | 7/2005 |
| TW | 200801343 A | 1/2008 |
| TW | 200846887 A | 12/2008 |

OTHER PUBLICATIONS

TW Office Action for Application No. 105132753, dated May 19, 2017, w/ Office Action Summary.
CN Office Action for Application No. 201610951752.5, dated Feb. 2, 2019, w/ First Office Action Summary.
CN Search Report for Application No. 201610951752.5, dated Feb. 2, 2019, w/ First Office Action.

* cited by examiner

COMPUTER DEVICE AND HOT SWAPPABLE FAN MODULE THEREOF

CROSS-REFERENCE TO RELATED APPLICATION

This application claims priority to Taiwan Application 105132753, titled "Computer Device and Hot Swappable Fan Module Thereof" and filed at Oct. 11, 2016, the disclosure of which is incorporated herein by reference in its entirety.

FIELD OF TECHNOLOGY

The present disclosure relates to a fan module, and more particularly to a hot swappable fan module.

BACKGROUND

Electronic devices running in a system produce heat, which may increase the ambient temperature of the system. Increased ambient temperature may reduce stability of the system and even cause a system failure. A cooling fan is typically used in a system to control the ambient temperature of the system and maintain stability of the system by providing a stable ambient temperature. To avoid shutting down of a system to replace a cooling fan, a hot swappable cooling fan can be installed to ensure continuous operation of the system. Some cooling fans are even provided with a status indicator, through which the state of the cooling fan is provided.

Typically, at least two sub-assemblies of a cooling fan are integrated through a fixing element (e.g., a bolt or buckle). If a status indicator is required on the cooling fan, available areas for disposing the fixing element on the cooling fan are reduced, which may cause the fixing element to exert an insufficient or uneven combining force on the cooling fan. When the cooling fan is unplugged from a system, a side of the cooling fan having a weaker combining force can be deformed by pulling or even fallen apart. As a result, there is a need to improve the stability of plugging or unplugging the cooling fan.

BRIEF SUMMARY

The present disclosure provides a hot swappable fan module, to solve the problem in the prior art. When the fan module is plugged or unplugged, the fan module is prevented from being deformed or even fallen apart, thereby reducing the probability that the fan module is damaged.

According to an example of the present disclosure, the hot swappable fan module includes an outer frame, a cooling fan, at least one fixing element, and a light guide assembly. The outer frame has a handle. The cooling fan is located on one side of the outer frame, and has an electrical connecting portion. The fixing element is operable to fix the outer frame and the cooling fan. The light guide assembly includes a light guide post, a first stopping portion, and a second stopping portion. The light guide post is arranged corresponding to the fixing element, and penetrates through the cooling fan and the outer frame. The first stopping portion is located on the light guide post, and abuts against one surface of the cooling fan opposite to the outer frame. The second stopping portion is light-transmittable and is optically coupled to the light guide post. The second stopping portion is arranged opposite to the first stopping portion and abuts against one surface of the outer frame opposite to the cooling fan.

In one or more examples of the present disclosure, the light guide post includes a light-transmitting column and a first threaded portion. The first threaded portion is formed on an end portion of the light-transmitting column. The second stopping portion is a nut containing a second threaded portion therein. Therefore, through screwing of the second threaded portion and the first threaded portion, the nut is operable to be sleeved on the end portion of the light guide post, and abuts against the surface of the outer frame opposite to the cooling fan.

In one or more examples of the present disclosure, the light guide assembly further includes a locking threaded stud. The locking threaded stud includes a hollow metal tube and a first threaded portion. The hollow metal tube penetrates through the cooling fan and the outer frame. The hollow metal tube has a hollow passage. The hollow passage and the hollow metal tube are coaxial, and can accommodate the light guide post. The first threaded portion is formed on an end portion of the hollow metal tube. The second stopping portion is a nut containing the second threaded portion therein. Therefore, through screwing of the second threaded portion and the first threaded portion, the nut is operable to be sleeved on the end portion of the hollow metal tube, and abuts against the surface of the outer frame opposite to the cooling fan.

In one or more examples of the present disclosure, the second stopping portion has a through hole. A long-axis-direction of the light guide post passes through the through hole.

In one or more examples of the present disclosure, the second stopping portion has a lens. A long-axis-direction of the light guide post passes through the lens.

In one or more examples of the present disclosure, the cooling fan includes a fan body and a safety cover. The fan body includes a fan frame and a blade fan. The fan frame has a frame groove, and the blade fan is pivotally located in the frame groove. The safety cover is connected to the fan frame and covers the frame groove. Further, the first stopping portion abuts against one surface of the safety cover opposite to the fan frame. Thus, the fan body can be clamped between the safety cover and the outer frame.

In one or more examples of the present disclosure, the electrical connecting portion is connected to the safety cover. An end surface of the light guide post is fixed on the electrical connecting portion.

In one or more examples of the present disclosure, the cooling fan includes a recessed portion and a guide groove. The recessed portion can be depressed on the cooling fan, for accommodating the first stopping portion. The guide groove is located in the recessed portion, for guiding the first stopping portion into the recessed portion.

In one or more examples of the present disclosure, a long-axis-direction of the light guide post is parallel to a long-axis-direction of the fixing element.

According to an example of the present disclosure, the hot swappable fan module includes a fan body, an outer frame, a safety cover, at least one first fixing element, and a second fixing element. The outer frame has a handle. The fan body is located between the outer frame and the safety cover, and has an electrical connecting portion. The electrical connecting portion is fixed on the safety cover. The first fixing element is operable to fix the outer frame, the safety cover, and the fan body. The second fixing element is arranged opposite to the first fixing element, and thus the fan body can clamped between the outer frame and the safety cover. The second fixing element has a light guide post capable of guiding light beams.

According to an example of the present disclosure, the computer device includes a casing, a circuit board, an electrical connector, a light-emitting diode, and the fan module. The casing has an accommodating groove. The circuit board is located in the casing. The electrical connector is located on the circuit board. The light-emitting diode is located on the circuit board and has a light output surface. A power source is electrically connected to the circuit board. The fan module is located in the accommodating groove in a pluggable manner. The fan module comprises an electrical connecting portion that is electrically connected to the electrical connector. One end of the light guide post faces the light output surface.

The problem to be solved by the present disclosure, the technical means for solving the problem and the efficacies thereof, and the like are described above, and the details of the present disclosure are specifically introduced in the following examples and the accompanying drawings.

BRIEF DESCRIPTION OF THE DRAWINGS

To make the above and other objectives, features, advantages, and examples of the present disclosure more comprehensible, the accompanying drawings are described as follows.

DETAILED DESCRIPTION

Examples of the present disclosure are disclosed below by the accompanying drawings, and for explicit description, many practical details will be illustrated in the following. However, it should be understood that, these practical details shall not limit the present disclosure. That is to say, in some examples of the present disclosure, these practical details are not necessary. Besides, to simplify the accompanying drawings, some conventional structures and elements are depicted in the accompanying drawings in a simple and demonstrative manner.

Figure 1:
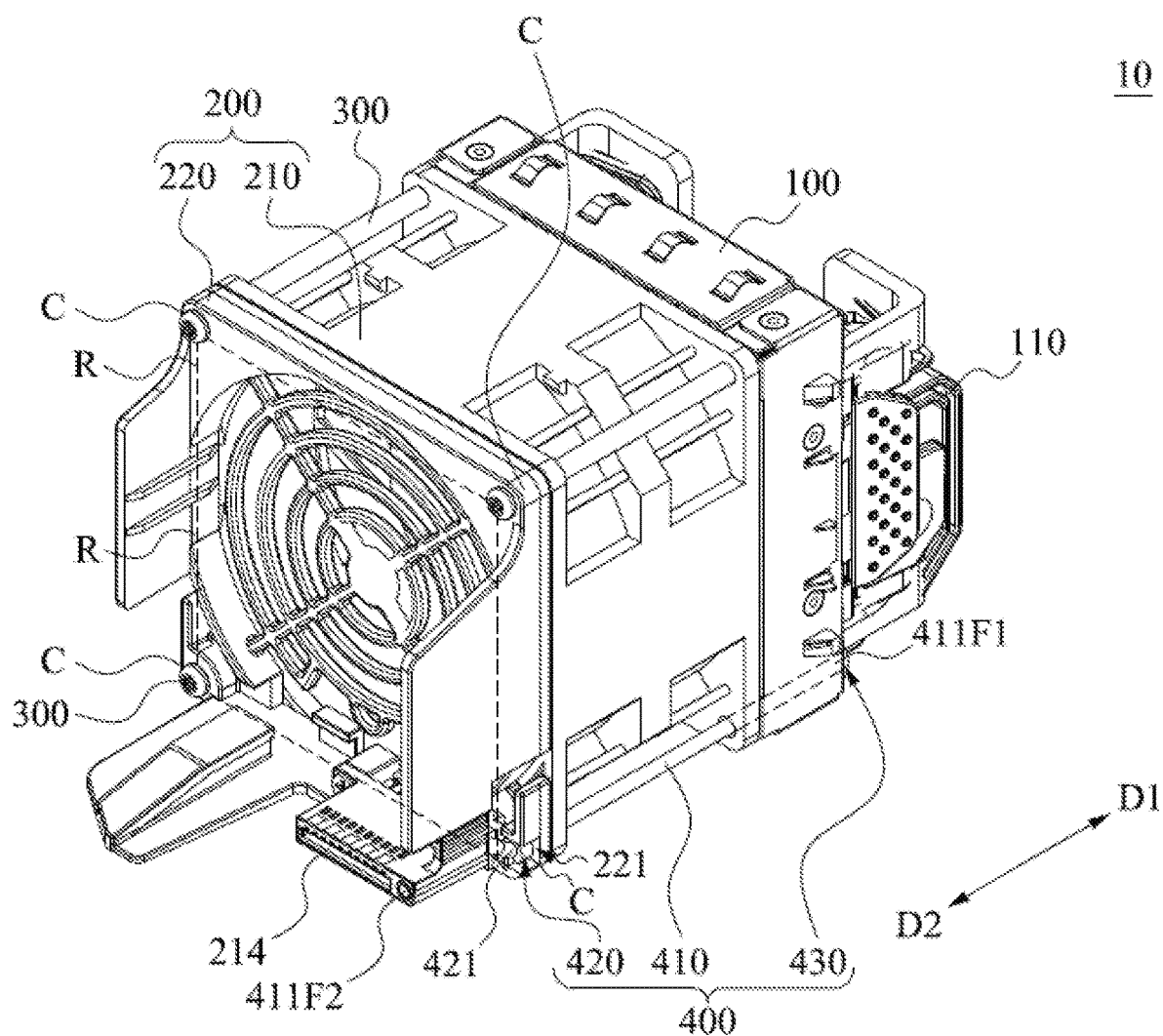
FIG. 1 illustrates a three-dimensional view of a hot swappable fan module according to an example of the present disclosure.
Figure 2:
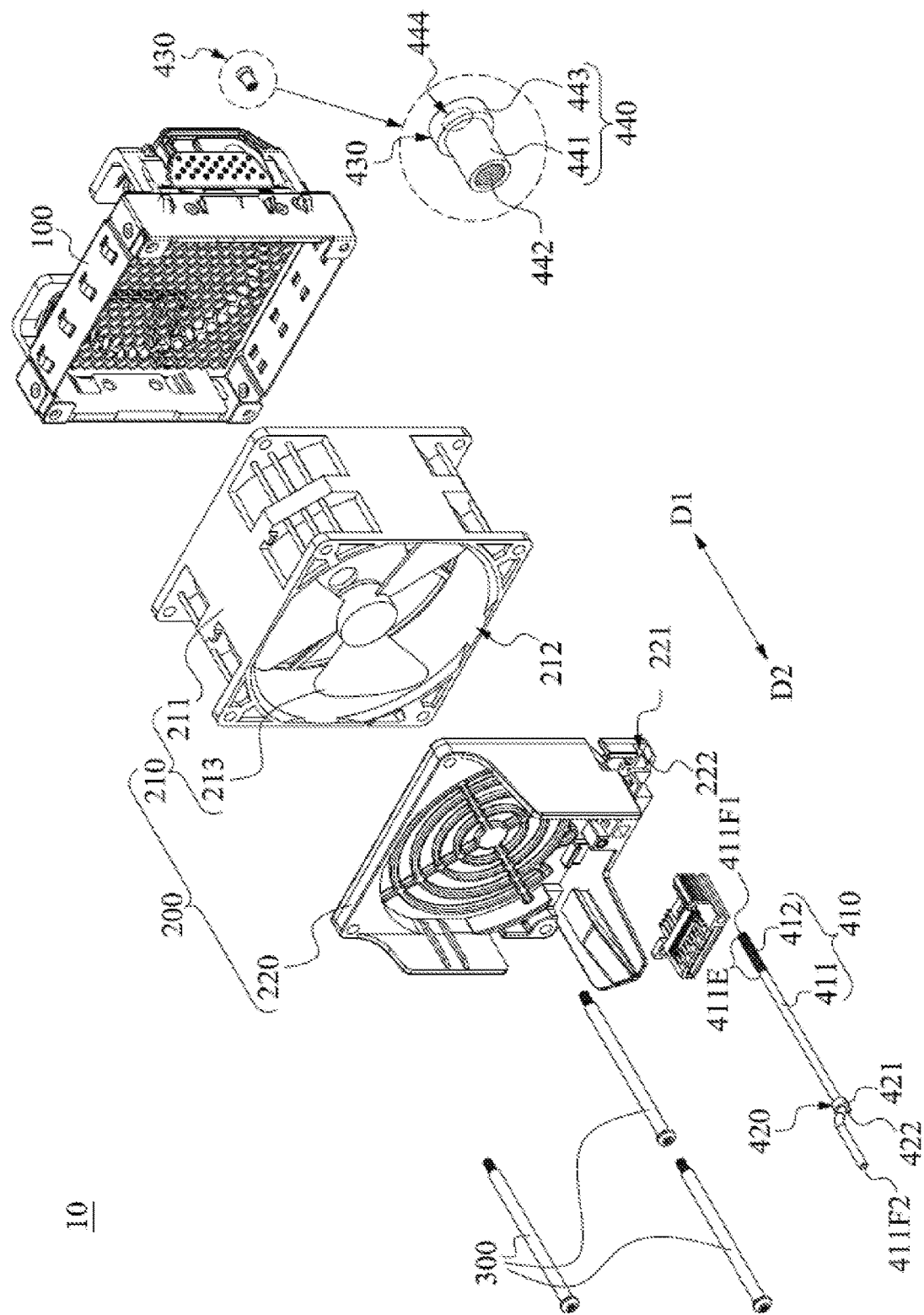
FIG. 2 illustrates an exploded view of the fan module in FIG. 1.

FIG. 1 illustrates a three-dimensional view of a hot swappable fan module 10 according to an example of the present disclosure. FIG. 2 illustrates an exploded view of the fan module 10 in FIG. 1. As shown in FIG. 1 and FIG. 2, in this example, the fan module 10 includes an outer frame 100, a cooling fan 200, multiple (for example, three) fixing elements 300 (for example, metal bolts), and a light guide assembly 400. The outer frame 100 has a handle 110. A user moves the fan module 10 through the handle 110. The cooling fan 200 is attached to one side of the outer frame 100, and the fixing elements 300 integrally fix the outer frame 100 and the cooling fan 200. The light guide assembly 400 includes a light guide post 410, a first stopping portion 420, and a second stopping portion 430. The light guide post 410 is arranged opposite to the fixing elements 300, and penetrates through the cooling fan 200 and the outer frame 100. The first stopping portion 420 is located on the light guide post 410, and abuts against one surface of the cooling fan 200 opposite to the outer frame 100. The second stopping portion 430 is arranged corresponding to the first stopping portion 420, is light-transmittable and is optically coupled to the light guide post 410, and abuts against one surface of the outer frame 100 opposite to the cooling fan 200. In this example, the cooling fan 200 includes a fan body 210 and a safety cover 220. The fan body 210 includes a fan frame 211 and a blade fan 213. The fan frame 211 has a frame groove 212, and the blade fan 213 is pivotally located in the frame groove 212. The safety cover 220 is connected to the fan frame 211 and covers the frame groove 212. Besides, the first stopping portion 420 abuts against one surface of the safety cover 220 opposite to the fan frame 211, and thus the fan body 210 is clamped between the safety cover 220 and the outer frame 100.

Therefore, because the first stopping portion 420 and the second stopping portion 430 oppositely abut against the safety cover 220 and the outer frame 100, that is, the first stopping portion 420 presses against one surface of the safety cover 220 opposite to the outer frame 100 in a first direction D1, and the second stopping portion 430 presses against one surface of the outer frame 100 opposite to the safety cover 220 in a second direction D2 opposite to the first direction D1, and thus the fan body 210 is clamped between the safety cover 220 and the outer frame 100. In this way, when the fan module 10 is unplugged, the fan module 10 may not be deformed by pulling or even fallen apart, thereby reducing the probability that the fan module 10 is damaged.

Further, in this example, the integrated structure of the cooling fan 200 and the outer frame 100 is generally in the shape of a rectangle R, and the light guide assembly 400 and the fixing elements 300 are uniformly located on the four corners C of the rectangle R, to provide a sufficient or an even combining force on the cooling fan 200 and the outer frame 100.

Specifically, the light guide post 410 includes a light-transmitting column 411 and a first threaded portion 412. The first threaded portion 412 is formed on an end portion 411E of the light-transmitting column 411. The second stopping portion 430 is a nut 440 containing a second threaded portion 442. For example, the nut 440 has a hollow sleeve 441 and a cap 443, the hollow sleeve 441 is connected to one side of the cap 443, and the second threaded portion 442 is formed on an inner wall of the hollow sleeve 441. Therefore, when the hollow sleeve 441 of the nut 440 is sleeved on the end portion 411E of the light-transmitting column 411, through screwing of the second threaded portion 442 and the first threaded portion 412, the cap 443 of the nut 440 presses against the surface of the outer frame 100 opposite to the cooling fan 200 in the second direction D2 (FIG. 1).

The second stopping portion 430 has a through hole 444. The through hole 444 is aligned with an end surface 411F1 of the light-transmitting column 411, and thus a long-axis-direction (with reference to line segments D1, D2) of the light guide post 410 passes through the through hole 444. For example, the through hole 444 is located on the cap 443 of the second stopping portion 430 and is communicated with the hollow sleeve 441. Thereby, light beams transmitted by the light guide post 410 may be emitted out via the through hole 444.

In this example, the first stopping portion 420 is an arc-shaped flange 421, which is integrally located on the surface of the light-transmitting column 411, and surrounds the light-transmitting column 411. Thus, the first stopping portion 420 presses against the surface of the cooling fan 200 opposite to the outer frame 100 in the first direction D1 (FIG. 1). However, the present disclosure does not limit that the first stopping portion is integrally located on the light-transmitting column. The light-transmitting column is, for example, made of light-transmitting plastics or glass, which is not limited in the present disclosure.

Besides, as shown in FIG. 1, the cooling fan 200 includes a recessed portion 221 and a guide groove 222. The recessed portion 221 is depressed on one surface of the safety cover 220 opposite to the fan body 210, for accommodating the first stopping portion 420. The guide groove 222 is located in the recessed portion 221, for limiting the first stopping portion 420. Therefore, when the first stopping portion 420 in the recessed portion 221 presses against an inner wall of the recessed portion 221, a rib 422 of the arc-shaped flange 421 may be inserted into the guide groove 222, which further facilitates guiding of the first stopping portion 420 into the recessed portion 221. Besides, the cooling fan 200 of the fan module 10 has an electrical connecting portion 214. The cooling fan 200 exchanges signals with the outside through the electrical connecting portion 214. The electrical connecting portion 214 is connected to the safety cover 220. The light guide post 410 is fixed on the electrical connecting portion 214 while being opposite to an end surface 411F2 of the second stopping portion 430.

Besides, because the fan body 210 is closely clamped between the outer frame 100 and the safety cover 220 by the light guide assembly 400, the light guide assembly 400 may be regarded as a fixing element having a light guide function or a fixing element made of a light-transmitting material in an example.

Figure 3:
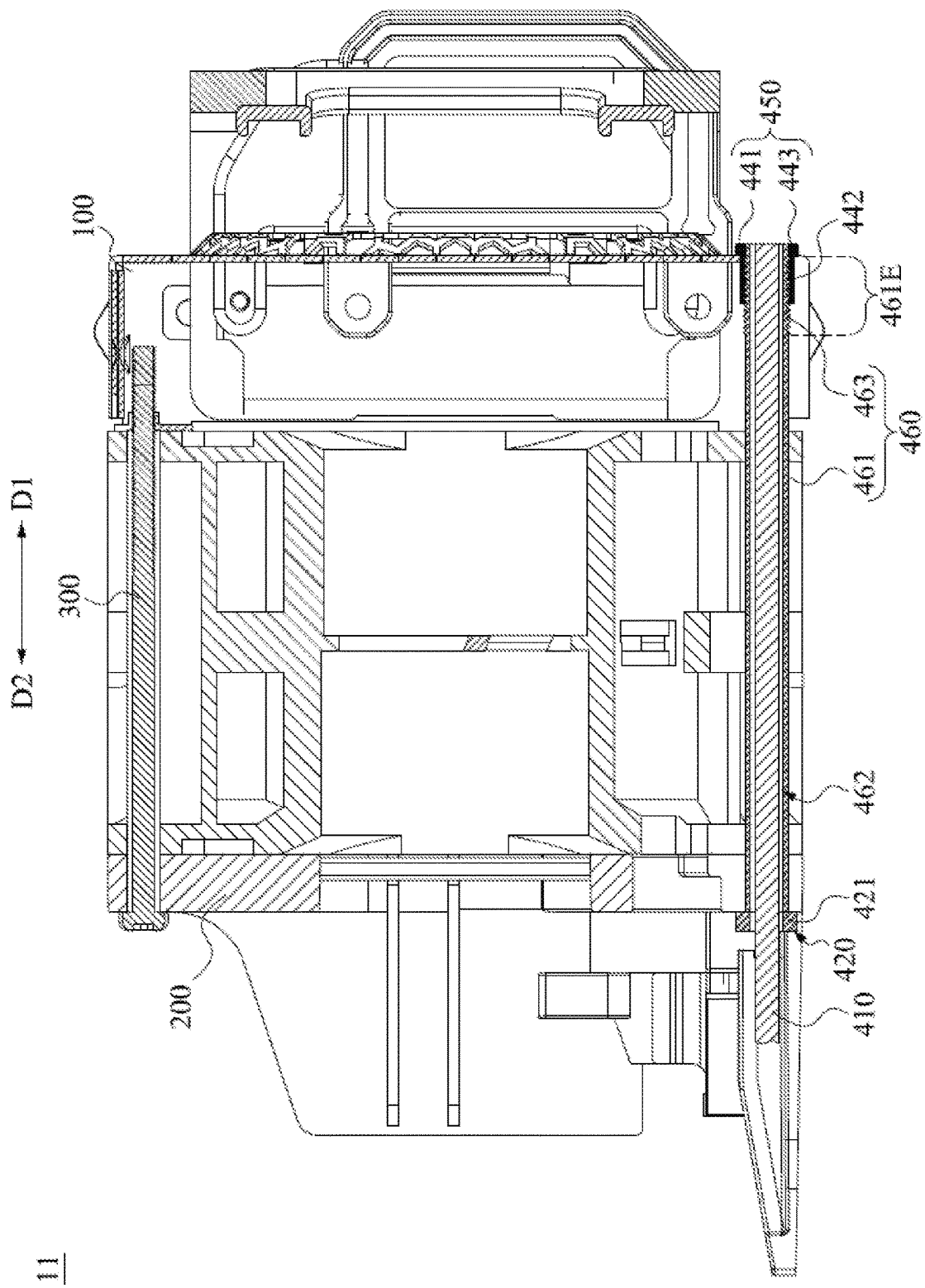
FIG. 3 illustrates a side view of a hot swappable fan module according to an example of the present disclosure.

FIG. 3 illustrates a side view of a hot swappable fan module 11 according to an example of the present disclosure. As shown in FIG. 3, the fan module 10 in FIG. 1 is substantially the same as the fan module 11 in FIG. 3, and one of the differences lies in that the light guide assembly further includes a locking threaded stud 460. The locking threaded stud 460 includes a hollow metal tube 461 and a third threaded portion 463. The hollow metal tube 461 penetrates through the cooling fan 200 and the outer frame 100. The hollow metal tube 461 has a hollow passage 462. The hollow passage 462 and the hollow metal tube 461 are coaxial, and accommodate a light guide post 410. The third threaded portion 463 is formed on an end portion 461E of the hollow metal tube 461, while the threaded portion is formed on the light guide post 410 as shown in FIG. 1. The second stopping portion 430 is a nut 450 containing the second threaded portion 442. Therefore, when the hollow sleeve 441 of the nut 450 is sleeved on the end portion 461E of the hollow metal tube 461, through screwing of the second threaded portion 442 and the third threaded portion 463, the nut 450 presses against the surface of the outer frame 100 opposite to the cooling fan 200 in the second direction D2. The nut 450 is substantially the same as the nut 440 in FIG. 2, and the details thereof may not be repeated herein.

It should be noted that, because the hardness of the hollow metal tube 461 is greater than that of the light-transmitting column made of a plastic material, the locking threaded stud 460 may provide a larger combining force on the cooling fan 200 and the outer frame 100. Besides, because the hardness of the hollow metal tube 461 of the locking threaded stud 460 is substantially close to that of the fixing elements 300, a more even combining force may be provided on the cooling fan 200 and the outer frame 100.

Besides, the first stopping portion 420 is an arc-shaped flange 421, which is integrally located on the surface of the hollow metal tube 461, and surrounds the hollow metal tube 461. Thereby, the first stopping portion 420 presses against the surface of the cooling fan 200 opposite to the outer frame 100 in the first direction D1. However, the present disclosure does not limit that the first stopping portion 420 is integrally located on the hollow metal tube 461.

Figure 4:
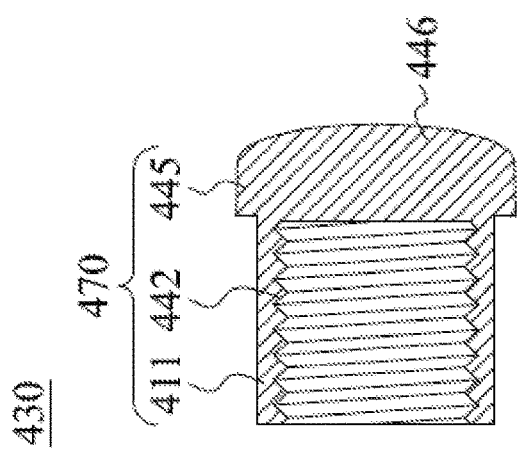
FIG. 4 illustrates a longitudinal sectional view of a second stopping portion according to an example of the present disclosure.

FIG. 4 illustrates a longitudinal sectional view of the second stopping portion 430 according to an example of the present disclosure. As shown in FIG. 4, the second stopping portion 430 in FIG. 2 is substantially the same as the second stopping portion 430 in FIG. 4, and one of the differences lies in that the second stopping portion in FIG. 2 has a through hole, while the second stopping portion 430 in FIG. 4 has a lens 446 optically coupled to the light guide post. The second stopping portion 430 is, for example, a nut 470. The lens 446 is located on a cap 445 of the nut 470. Therefore, referring to FIG. 3, the light beams transmitted by the light guide post 410 may be refracted or scattered through guiding of the lens 446, to achieve the expected light guide purpose. In an example, when the light beams are diverged through the lens 446, a user does not need to stare at the nut 470 in order to observe the light beams transmitted by the light guide post. In another example, when the light beams are converged through the lens 446 into a light spot on a plane (for example, wall surface), the fan module is located between the user and the plane (for example, wall surface), and the user may know about the state information of the fan module by observing the light spot on the plane (for example, wall surface).

Figure 5:
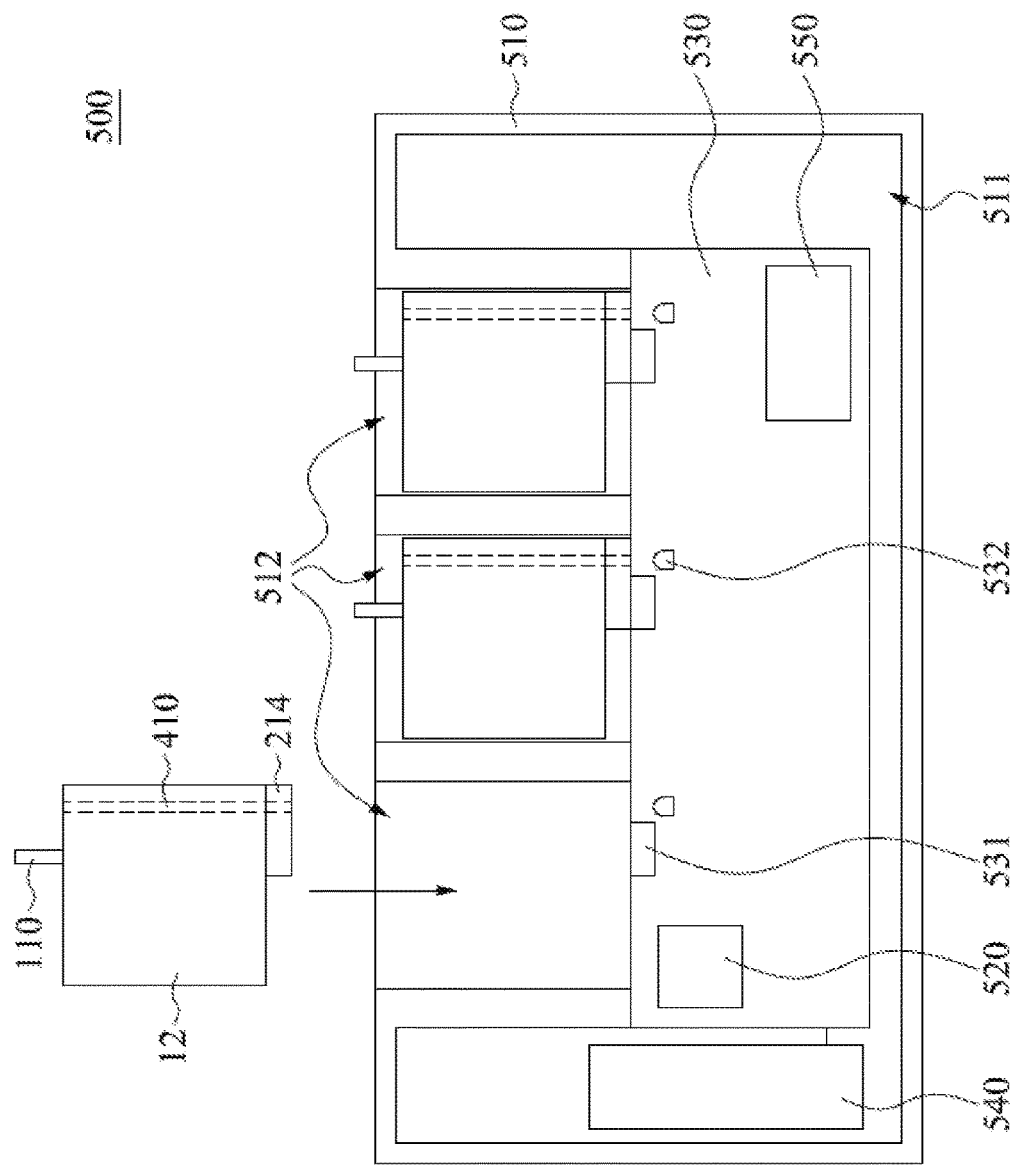
FIG. 5 illustrates a schematic view of a computer device according to an example of the present disclosure.

FIG. 5 illustrates a schematic view of a computer device 500 according to an example of the present disclosure. As shown in FIG. 1 and FIG. 5, the computer device 500 is, for example, a server, and includes a casing 510, multiple electronic elements, and multiple hot swappable fan modules 12. The casing 510 has an accommodating space 511 and multiple accommodating grooves 512. The accommodating grooves 512 are arranged in parallel on one side of the casing 510 at intervals, and are communicated with the accommodating space 511. Each accommodating groove 512 may accommodate one fan module 12. Each fan module 12 may have all the technical features of the fan modules 10, 11 in the above examples. The electronic elements are all located in the accommodating space 511, and are operating units available in a computer, such as a processing unit 520 (processor), a circuit board 530 (for example, mainboard), a power source 540, and a storage device 550 (for example, hard disk drive (HDD) or solid state drive (SSD)). The power source 540 respectively supplies power for working to the processing unit 520, the circuit board 530, the storage device 550, and the fan modules 12. The circuit board 530 has multiple electrical connectors 531 and multiple light-emitting diodes 532. The power source 540 is respectively electrically connected to the electrical connectors 531 and the light-emitting diodes 532 through the circuit board 530.

Therefore, when a user pushes one fan module 12 into the corresponding accommodating groove 512, the electrical connecting portion 214 of the fan module 12 is electrically connected to one electrical connector 531 of the circuit board 530, and an end surface 411F1 of the light guide post 410 in the fan module 12 faces one light-emitting diode 532 in the circuit board 530. On the contrary, when a user intends to pull one fan module 12 out of the corresponding accommodating groove 512, the user can move the fan module 12 out of the accommodating groove 512 by exerting a force on the handle 110, such that the electrical connecting portion 214 of the fan module 12 is detached from the corresponding electrical connector 531, and the light guide post 410 is away from the corresponding light-emitting diode 532. Therefore, the fan module 12 may not be deformed by pulling or even fallen apart, thereby reducing the probability that the fan module 12 is damaged.

Finally, the disclosed examples are not intended to limit the present disclosure. Persons skilled in the art can make modifications and variations without departing from the spirit and scope of the present disclosure, and these modifications and variations all fall within the protection scope of the present disclosure. Therefore, the protection scope of the present disclosure is defined by the appended claims.

What is claimed is:

1. A hot swappable fan module, comprising:
   an outer frame, having a handle;
   a cooling fan, located on one side of the outer frame, and having an electrical connecting portion;
   three fixing elements, operable to fix the outer frame and the cooling fan, wherein the three fixing elements provide corresponding combining forces on the outer frame and the cooling fan, the corresponding combining forces being substantially even with each other;
   a light guide assembly, operable as a fourth fixing element providing a combining force substantially even with the combining forces of the three fixing elements, comprising:
   a light guide post, arranged corresponding to the fourth fixing element, and penetrating through the cooling fan and the outer frame; wherein the light guide post comprises a light-transmitting column and a first threaded portion, the first threaded portion being formed on an end portion of the light-transmitting column;
   a first stopping portion, located on the light guide post, and abutting against one surface of the cooling fan opposite to the outer frame;
   a second stopping portion, arranged opposite to the first stopping portion and abutting against one surface of the outer frame opposite to the cooling fan, wherein the second stopping portion is light-transmittable and is optically coupled to the light guide post; wherein the second stopping portion comprises a nut containing a second threaded portion therein;
   wherein, through screwing of the second threaded portion on the first threaded portion, the nut is operable to sleeve onto the end portion of the light-transmitting column;
   wherein the light guide assembly further comprises a locking threaded stud, the locking threaded stud comprising:
   a hollow metal tube penetrating through the cooling fan and the outer frame, the hollow metal tube having a hollow passage, and the hollow passage and the hollow metal tube being coaxial and accommodating the light guide post; and
   a third threaded portion, the third threaded portion formed on an end portion of the hollow metal tube; and a second nut containing a fourth threaded portion;
   wherein, through screwing of the second nut containing the fourth threaded portion with the third threaded portion, the second nut is operable to sleeve on the end portion of the hollow metal tube.

2. The hot swappable fan module according to claim 1, wherein the second stopping portion has a through hole, and wherein a long-axis-direction of the light guide post passes through the through hole.

3. The hot swappable fan module according to claim 1, wherein the second stopping portion has a lens, and wherein a long-axis-direction of the light guide post passes through the lens.

4. The hot swappable fan module according to claim 1, wherein the cooling fan comprises:
   a fan body, comprising a fan frame and a blade fan, the fan frame having a frame groove, and the blade fan being pivotally located in the frame groove; and
   a safety cover, connected to the fan frame and covering the frame groove,
   wherein the first stopping portion abuts against one surface of the safety cover opposite to the fan frame, and wherein the fan body is clamped between the safety cover and the outer frame.

5. The hot swappable fan module according to claim 4, wherein an end surface of the light guide post is fixed on the electrical connecting portion.

6. The hot swappable fan module according to claim 1, wherein the cooling fan comprises:
   a recessed portion, depressed on the cooling fan, operable to accommodate the first stopping portion; and
   a guide groove, located in the recessed portion, operable to guide the first stopping portion into the recessed portion.

7. A computer device, comprising:
   a casing, having at least one accommodating groove;
   a circuit board, located in the casing;
   an electrical connector, located on the circuit board;
   a light-emitting diode, located on the circuit board;
   a power source, electrically connected to the circuit board; and
   a hot swappable fan module, located in the accommodating groove in a pluggable manner, the hot swappable fan module comprising:
   an outer frame, having a handle;
   a cooling fan, located on one side of the outer frame, and having an electrical connecting portion;
   three fixing elements, operable to fix the outer frame and the cooling fan, wherein the three fixing elements provide corresponding combining forces on the outer frame and the cooling fan, the corresponding combining forces being substantially even with each other; and
   a light guide assembly, operable as a fourth fixing element providing a combining force substantially even with the combining forces of the three fixing elements, comprising:
   a light guide post, arranged corresponding to the fourth fixing element, and penetrating through the cooling fan and the outer frame; wherein the light guide post comprises a light-transmitting column and a first threaded portion, the first threaded portion being formed on an end portion of the light-transmitting column;
   a first stopping portion, located on the light guide post, and abutting against one surface of the cooling fan opposite to the outer frame;
   a second stopping portion, arranged opposite to the first stopping portion and abutting against one surface of the outer frame opposite to the cooling fan, wherein the second stopping portion is light-transmittable and is optically coupled to the light guide post, wherein the second stopping portion comprises a nut containing a second threaded portion;

wherein, through screwing of the second threaded portion on the first threaded portion, the nut is operable to sleeve onto the end portion of the light-transmitting column;

wherein the light guide assembly further comprises a locking threaded stud, the locking threaded stud comprising:

a hollow metal tube penetrating through the cooling fan and the outer frame, the hollow metal tube having a hollow passage, and the hollow passage and the hollow metal tube being coaxial and accommodating the light guide post; and a third threaded portion, the third threaded portion formed on an end portion of the hollow metal tube; and a second nut containing a fourth threaded portion;

wherein, through screwing of the second nut containing the fourth threaded portion with the third threaded portion, the second nut is operable to sleeve on the end portion of the hollow metal tube; and wherein the electrical connecting portion being electrically connected to the electrical connector, and one end of the light guide post facing the light-emitting diode.

8. The computer device according to claim 7, wherein the second stopping portion has a through hole, and wherein a long-axis-direction of the light guide post passes through the through hole.

9. The computer device according to claim 7, wherein the second stopping portion has a lens, and a long-axis-direction of the light guide post passes through the lens.

10. The computer device according to claim 7, wherein the cooling fan comprises:

a fan body, comprising a fan frame and a blade fan, the fan frame having a frame groove, and the blade fan being pivotally located in the frame groove; and a safety cover, connected to the fan frame and covering the frame groove, wherein the first stopping portion abuts against one surface of the safety cover opposite to the fan frame, and wherein the fan body is clamped between the safety cover and the outer frame.

11. The computer device according to claim 7, wherein an end surface of the light guide post is fixed on the electrical connecting portion.

12. The computer device according to claim 7, wherein the cooling fan comprises:

a recessed portion, depressed on the cooling fan, operable to accommodate the first stopping portion; and a guide groove, located in the recessed portion, operable to guide the first stopping portion into the recessed portion.

13. The computer device according to claim 7, wherein the first stopping portion is an arc-shaped flange.

14. A hot swappable fan module, comprising:

an outer frame, having a handle;

a cooling fan, located on one side of the outer frame, and having an electrical connecting portion;

three fixing elements, operable to fix the outer frame and the cooling fan, wherein the three fixing elements provide corresponding combining forces on the outer frame and the cooling fan, the corresponding combining forces being substantially even with each other;

a light guide assembly, operable as a fourth fixing element providing a combining force substantially even with the combining forces of the three fixing elements, comprising:

a light guide post, arranged corresponding to the fourth fixing element, and penetrating through the cooling fan and the outer frame;

a first stopping portion, located on the light guide post, and abutting against one surface of the cooling fan opposite to the outer frame;

a second stopping portion, arranged opposite to the first stopping portion and abutting against one surface of the outer frame opposite to the cooling fan, wherein the second stopping portion is light-transmittable and is optically coupled to the light guide post;

wherein the first stopping portion is an arc-shaped flange; and, wherein the arc-shaped flange further comprises a rib configured to be received by the guide groove.

* * * * *